(12) United States Patent
Park

(10) Patent No.: US 8,051,344 B2
(45) Date of Patent: *Nov. 1, 2011

(54) SEMICONDUCTOR MEMORY TESTING DEVICE AND METHOD OF TESTING SEMICONDUCTOR USING THE SAME

(75) Inventor: Byoung Kwon Park, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/016,074

(22) Filed: Jan. 28, 2011

(65) Prior Publication Data

US 2011/0131457 A1 Jun. 2, 2011

Related U.S. Application Data

(63) Continuation of application No. 12/205,036, filed on Sep. 5, 2008, now Pat. No. 7,904,767.

(30) Foreign Application Priority Data

Oct. 11, 2007 (KR) .................. 10-2007-0102816

(51) Int. Cl.
*G11C 29/00* (2006.01)
*G11C 8/00* (2006.01)
(52) U.S. Cl. .................. 714/718; 365/230.03
(58) Field of Classification Search .................. 714/718
See application file for complete search history.

(56) References Cited

U.S. PATENT DOCUMENTS 5,276,647 A * 1/1994 Matsui et al.
5,384,784 A * 1/1995 Mori et al.
5,757,816 A * 5/1998 Al-Assadi et al.
5,959,930 A * 9/1999 Sakurai .................. 365/230.03
6,512,692 B2 * 1/2003 Yamauchi et al.
6,542,431 B2 * 4/2003 Nakagawa
6,643,175 B2 * 11/2003 Yamauchi et al. ....... 365/185.11
6,658,609 B1 * 12/2003 Saito et al.
7,574,636 B2 * 8/2009 Lee et al.

FOREIGN PATENT DOCUMENTS

JP       2002-304899 A  * 10/2002
KR    1020010010440 A  *  2/2001
KR    1020070004333 A  *  1/2007

OTHER PUBLICATIONS

USPTO OA mailed Jul. 13, 2010 in connection with U.S. Appl. No. 12/205,036.*
USPTO NOA mailed Oct. 29, 2010 in connection with U.S. Appl. No. 12/205,036.*

* cited by examiner

*Primary Examiner* — Jame C Kerveros
(74) *Attorney, Agent, or Firm* — Ladas & Parry LLP

(57) ABSTRACT

The semiconductor memory testing device includes a test signal decoder decoding burn-in test mode signals which generates a first test signal for use in controlling entire main wordlines and which generates a second test signal for use in controlling sub wordlines. When the first and second test signals are in an disabled state, the semiconductor memory testing device also includes a plurality of bank control units generating a multi wordline test mode signal as a multi wordline test signal corresponding to a bank control signal, and simultaneously enabling a plurality of wordlines in accordance to the multi wordline test signal to perform a test. The semiconductor memory testing device reduces a testing time and current consumption and thus enhances a more stable voltage drop when performing continuous multi wordline test on a per bank basis.

12 Claims, 7 Drawing Sheets

SEMICONDUCTOR MEMORY TESTING DEVICE AND METHOD OF TESTING SEMICONDUCTOR USING THE SAME

CROSS-REFERENCE TO RELATED APPLICATIONS

The present continuation application claims benefit of priority to U.S. non-provisional U.S. patent application Ser. No. 12/205,036, now U.S. Pat. No. 7,904,767, filed Sep. 5, 2008 and also claims benefit of priority to Korean patent application number 10-2007-0102816 filed on Oct. 11, 2007, in which the present continuation application incorporates all of these priority applications here by reference in their entirety.

BACKGROUND OF THE INVENTION

The present invention relates to a memory testing device, and more particularly to a semiconductor memory testing device and an associated method which simultaneously enables a plurality of wordlines to be efficiently and rapidly tested.

Generally the production cost for a dynamic random access memory (DRAM) can be broadly divided into fabrication costs and testing cost. Recent trends indicate that the test costs are increasing as compared to the fabrication cost for these highly integrated DRAM devices.

One solution for reducing this testing cost is to employ a multi wordline testing technique. The multi wordline test is designed to detect leak currents due to drops in threshold voltage when a wordline is in active state. The multi wordline testing is usually performed in such a manner that enables a plurality of wordlines at the same time to test.

As depicted in FIG. 1, the semiconductor test device according to a related art includes a test signal decoder 10 and a plurality of bank control units 16.

The test signal decoder 10 includes first and second burn-in test signal generation units 12 and 14.

The first burn-in test signal generation unit 12 generates a first burn-in test signal TAW that is used to enable a given entire main wordline when any one of burn-in test mode signals TM<1:4> is in an enabled state and when a multi wordline test mode signal T14WL is in an enabled state.

The second burn-in test signal generation unit 14 inputs the burn-in test mode signals TM<1:4> and subsequently generates second burn-in test signals TFX<0:3> which are used to subsequently selectively enable sub wordline testing.

The first burn-in test signal TAW and the second burn-in test signals TFX<0:3> are respectively provided to a plurality of bank control units 16.

Herein, the multi wordline test mode signal T14WL is understood to mean a test mode signal applied by a mode register set (not shown) that can be used to enable ¼ of a given wordline.

As depicted in FIG. 2, each bank control unit 16 includes an address latch unit 20, main address predecoders 22, a main wordline driving unit 24, a sub address predecoder 26, sub wordline driving units 28 and a wordline driving unit 29.

The address latch unit 20 latches any one of the inputted address signals A<0:13> in accordance to a bank control signal BCi and then outputs a corresponding given main address signal BXA<a>.

Each main address predecoder 22 inputs and predecodes the given main address signal BXA<a> outputted from the address latch unit 20 and controls the output of the predecoded main address signals LAXa<0:1> in accordance to the first burn-in test signal TAW.

The main wordline driving unit 24 inputs the predecoded main address signals LAXa<0:1> and outputs a main-wordline driving signal MWLa, in accordance to the predecoded main address signals LAXa<0:1>, to a wordline driving unit 29.

The sub address predecoder 26 inputs and predecodes sub-address signals BXA<0:1> outputted from the address latch unit 20 in accordance to the bank control signal BCi. The sub-address predecoder 26 subsequently controls the output of the predecoded sub address signals LAX01<0:3>, in accordance to the second burn-in test signals TFX<0:3>, to corresponding sub-wordline driving units 28. Each sub-wordline driving unit 28 can then output a corresponding sub-wordline driving signal FX<0:3> to the wordline driving unit 29.

The wordline driving unit 29 drives a plurality of wordline signals WL selected in accordance to the inputted main-wordline driving signal MWLa and the inputted sub-wordline driving signal FX<0:3>.

An operation of the multi wordline test will be described with reference to FIGS. 1 and 2.

The multi wordline test operation is performed when the multi wordline test mode signal T14WL is set at an enabled state and the burn-in test mode signals TM<1:4> is set at a disabled state. That is, the first burn-in test signal TAW is set at an enabled state in accordance to when the multi wordline test mode signal T14WL is set at an enabled state and when the second burn-in test signals TFX<0:3> are all set at a disabled state.

Each main address predecoder 22 outputs the output signal LAXa<0:1> in an enabled state when the inputted first burn-in test signal TAW is in an enabled state regardless of the inputted main address signal BXA<a>. Therefore, the main wordline driving unit 24 outputs all of the corresponding main wordline driving signals MWLa in an enabled state.

The sub-address predecoder 26 outputs the output signal LAX01<0:3> in an enabled state in accordance to the inputted sub-address signal BXA<0:1> when the second burn-in test signals TFX<0:3> are all in a disabled state.

Each sub wordline driving unit 28 inputs a corresponding output signal LAX01<0:3> and subsequently outputs a corresponding sub-wordline driving signal FX<0:3> in an enabled state. Therefore, any one of the sub-wordline driving signals FX<0:3> is enabled.

The wordline driving unit 29 inputs any one of the sub-wordline driving signal FX<0:3> outputted from any one of the sub-wordline driving units 28 and also inputs the main wordline driving signal MWLa outputted from the main wordline driving unit 24, so that the wordline driving unit 29 can subsequently output any one corresponding wordline signal WL. Therefore, ¼ of a given wordline of an entire wordline can be tested at the same time when performing the multi word line test when using the related art.

Unfortunately, a number of problems can arise when using the related art to perform multi wordline testing. Since all banks are tested regardless of the state of the bank control signal BCi, then a problem in controlling a voltage drop can adversely affect the accuracy of the testing results of the memory cells. This problem can be further aggravated in the semiconductor test device of the related art when the number of the wordlines which are enabled at the same time is sequentially increased, because the plurality of wordlines driven in previous steps are not precharged when the multi wordline test is continuously performed.

Referring now to FIG. 3, the above noted problem associated with related art semiconductor test devices that are used to continuously perform the multi wordline testing will be further described.

Herein, the bank control signal BCi is provided on a per bank basis, and is in an enabled state corresponding to the active signals ACT1 through ACT4 and is in a disabled state corresponding to the precharge signal PCG1 through PCG4.

When continuously performing the multi wordline test, the first burn-in test signal TAW is maintained in an enabled state as the multi wordline test mode signal T14WL is maintained in an enabled state.

When the active signals ACT1 through ACT4 and the precharge signals PCG1 through PCG4 are sequentially applied, the predecoded address LAX01<0:3> is sequentially changed assuming that the sub address BXA<0:1> is also sequentially changed.

Specifically, the predecoded address LAX01<0> is set to an enabled state as a high level when in synchronization with the active signal ACT1 and the predecoded address LAX01<0> is set to a disabled state as a low level when in synchronization with the precharge signal PCG1. Likewise, the predecoded address signals LAX01<1:3> are set at an enabled state as a high level when in synchronization with their respective active signals ACT2 through ACT4. Likewise, the predecoded address signals LAX01<1:3> are set at a disabled state as a low level when in synchronization with their respective precharge signals PCG2 through PCG4.

In the related art, the sub wordline driving signals FX<0:3> outputted from the respective sub wordline driving units 28 are set in an enabled state when in synchronization with their respective enabled predecoded address signals LAX<0:3>. This operation results in maintaining the previous set states when the first burn-in test signal TAW is maintained in the enabled state set at a high level.

As a consequence, when the number of sub wordlines maintained in an enabled state is increased when performing continuously the multi wordline testing, the number of the wordlines which are set at an enabled state at the same time is sequentially increased, which in turn makes it difficult to continue testing.

SUMMARY OF THE INVENTION

There is provided a semiconductor test device that generates a multi wordline test signal corresponding to a bank control signal and which performs a multi wordline test on a per bank basis in accordance to the multi wordline test signal. Thereby performing the multi wordline test with the present semiconductor test device promises to minimize the above problem by providing an improved control in maintaining a relatively constant voltage drop when testing wordlines.

There is also provided a semiconductor test device that precharges the wordlines enabled by the multi wordline test signal to perform continuously the multi wordline test, thereby improving test time.

According to a first aspect of the present invention, there is provided a semiconductor test device, which includes: a test signal decoder decoding burn-in test mode signals to generate a first test signal which controls entire main wordlines and second test signal which controls sub wordlines; and a plurality of bank control units generating, in a state that the first and second test signals are disabled, a multi wordline test mode signal as a multi wordline test signal corresponding to a bank control signal, and enabling a plurality of wordlines at the same time in accordance to the multi wordline test signal to perform a test.

Preferably, the test signal decoder includes a first test signal generation unit enabling and outputting the first test signal when any one of the burn-in test mode signals is enabled; and a second test signal generation unit selectively enabling and outputting the second test signals in accordance to a combination of the burn-in test mode signals.

Preferably, each bank control unit includes a multi wordline test signal generation unit outputting a multi wordline test mode signal as a multi wordline test signal corresponding to a bank control signal in a state that the first test signal is disabled; a main wordline control unit predecoding some of a plurality of addresses to output a main wordline driving signal controlled by the multi wordline test signal; a sub wordline control unit predecoding the rest of the plurality of addresses to output a sub wordline driving signal in a state that the second test signals are disabled, and precharging an output node for the sub wordline driving signal by the multi wordline test signal; and a wordline driving unit applied with the main wordline driving signal and the sub wordline driving signal and driving a plurality of wordlines at the same time by enabling of the main wordline driving signal and the sub wordline driving signal.

Preferably, the bank control signal is enabled in accordance to an active signal and disabled in accordance to a precharge signal.

Preferably, the multi wordline test signal generation unit includes a signal generation unit outputting the multi wordline test mode signal as a signal synchronized with the bank control signal; and an output unit outputting the output of the signal generation unit as the multi wordline test signal when the first test signal is disabled.

Preferably, the main wordline control unit includes a plurality of main address predecoders predecoding some of the plurality of the addresses and enabling and outputting all the predecoded signals when the multi wordline test signal is enabled, respectively; and a main wordline driving unit outputting the main wordline driving signal in accordance to outputs of the main address predecoders.

Preferably, the sub wordline control unit includes sub address predecoder predecoding and outputting the rest of the plurality of addresses when the second test signals are disabled; and a plurality of sub wordline driving units outputting the sub wordline driving signal in correspondence to respective outputs of the sub address predecoder, and precharging the output node for the enabled sub wordline driving signal when the multi word line test signal is disabled.

Preferably, each sub wordline driving unit includes a shift unit shifting a potential of the signal outputted from the sub address predecoder; a latch unit latching the output of the shift unit; an output unit inversely driving the output of the latch unit to output the sub wordline driving signal; and a precharge unit precharging the output node of the shift unit in accordance to the multi wordline test signal.

Preferably, the precharge unit includes a first inverter inverting the multi wordline test signal; a NAND gate receiving the output of the first inverter and a control signal enabled in a test mode; and a second inverter inverting the output of the NAND gate and delivering it to the shift unit.

According to a second aspect of the present invention, there is provided a semiconductor test device, which includes: a multi wordline test signal generation unit outputting a multi wordline test mode signal as a multi wordline test signal which is synchronized with a bank control signal provided on a per bank basis; and a wordline control unit enabling a main word line driving signal and a sub wordline driving signal in correspondence to enabling of the multi wordline test signal to drive a plurality of wordlines, and precharging the plurality of driven wordlines which correspond to disabling of the multi wordline test signal.

Preferably, the bank control signal is enabled in accordance to an active signal and disabled in accordance to a precharge signal.

Preferably, the multi wordline test signal generation unit includes a signal generation unit outputting the multi wordline test mode signal as a signal which synchronized with the bank control signal; and an output unit enabling and outputting the multi wordline test signal when at least one of the output of the signal generation unit and a signal which enables entire main wordlines enabled for performing a burn-in test.

Preferably, the wordline control unit includes a plurality of main address predecoders respectively predecoding some bits of the address and controlling output of the predecoded signal in accordance to the multi wordline test signal; a main wordline driving unit outputting the main wordline driving signal in accordance to the outputs of the plurality of main address predecoders; a sub address predecoder predecoding and outputting the rest bits of the address; a plurality of sub wordline driving unit outputting the respective outputs of the sub address predecoder as the sub wordline driving signal, and precharging an output node for the wordline driving signal; and a wordline driving unit applied with the main wordline driving signal and the sub wordline driving signal and driving a plurality of wordlines at the same time by enabling of the main wordline driving signal and the sub wordline driving signal.

Preferably, each sub wordline driving unit includes a shift unit shifting a potential of the signal outputted from the sub address predecoder; a latch unit latching the output of the shift unit; an output unit inversely driving the output of the latch unit to output the sub wordline driving signal; and a precharge unit precharging the output node of the shift unit in accordance to the multi wordline test signal.

Preferably, the precharge unit includes a first inverter inverting the multi wordline test signal; a NAND gate receiving the output of the first inverter and a control signal enabled in a test mode; and a second inverter inverting the output of the NAND gate and delivering it to the shift unit.

According to a third aspect of the present invention, there is provided a method of testing a semiconductor, which includes: outputting, in a state that a burn-in test signal is disabled, a multi wordline mode test signal as a multi wordline test signal which is synchronized with the bank control signal provided on a per bank basis; enabling the entire corresponding main wordline driving signals when the multi wordline test signal is enabled, predecoding a sub address to enable a sub wordline driving signal, and driving a plurality of wordlines at the same time in accordance to the main wordline driving signal and sub wordline driving signal; and precharging the plurality of driven wordlines when the multi wordline test signal is disabled.

Preferably, the bank control signal is enabled in accordance to an active signal and disabled in accordance to a precharge signal.

Preferably, the multi wordline test signal maintains an enabled state during the burn-in test signal is enabled.

According to the present invention, there is an advantage of improving drop in the voltage provided to the wordline by providing a semiconductor memory testing device that generates a multi wordline test signal corresponding to a bank control signal and performs a multi wordline test on a per bank basis by the multi wordline test signal.

Also, according to the present invention, there is an advantage of improving test time by providing a semiconductor memory testing device that precharges the wordlines enabled in accordance to the multi wordline test signal to perform continuously the multi wordline test.

DESCRIPTION OF SPECIFIC EMBODIMENTS

Hereinafter, preferred embodiments of the present invention will be described in detail with reference to the accompanying drawings.

The present invention discloses a semiconductor test device and a method of testing a semiconductor using the same that generates a multi wordline test signal controlled by a bank control signal for controlling a respective bank and which performs a multi wordline test on a per bank basis in accordance to the multi wordline test signal.

Figure 1:
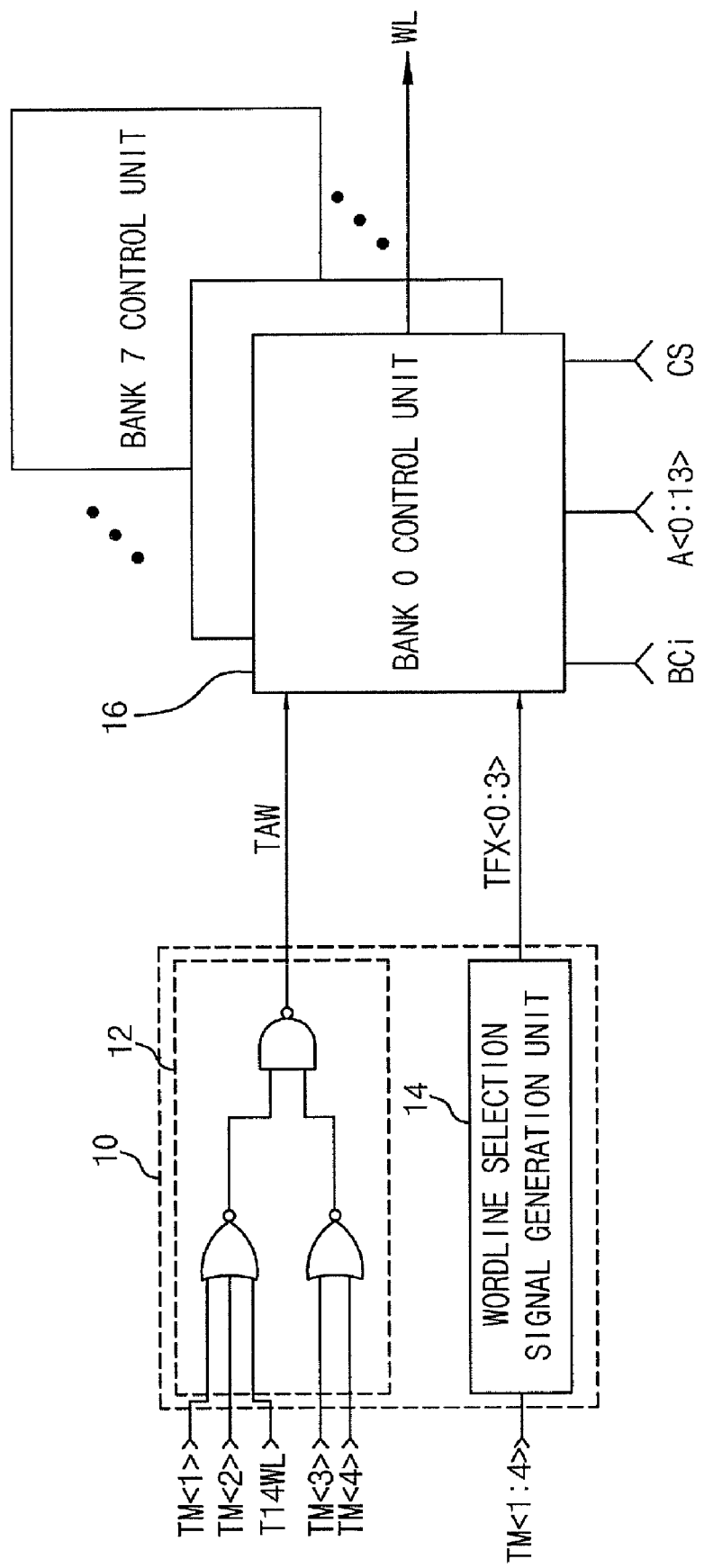
FIG. 1 is a block diagram showing a semiconductor memory testing device performing a multi wordline test according to a related art.
Figure 2:
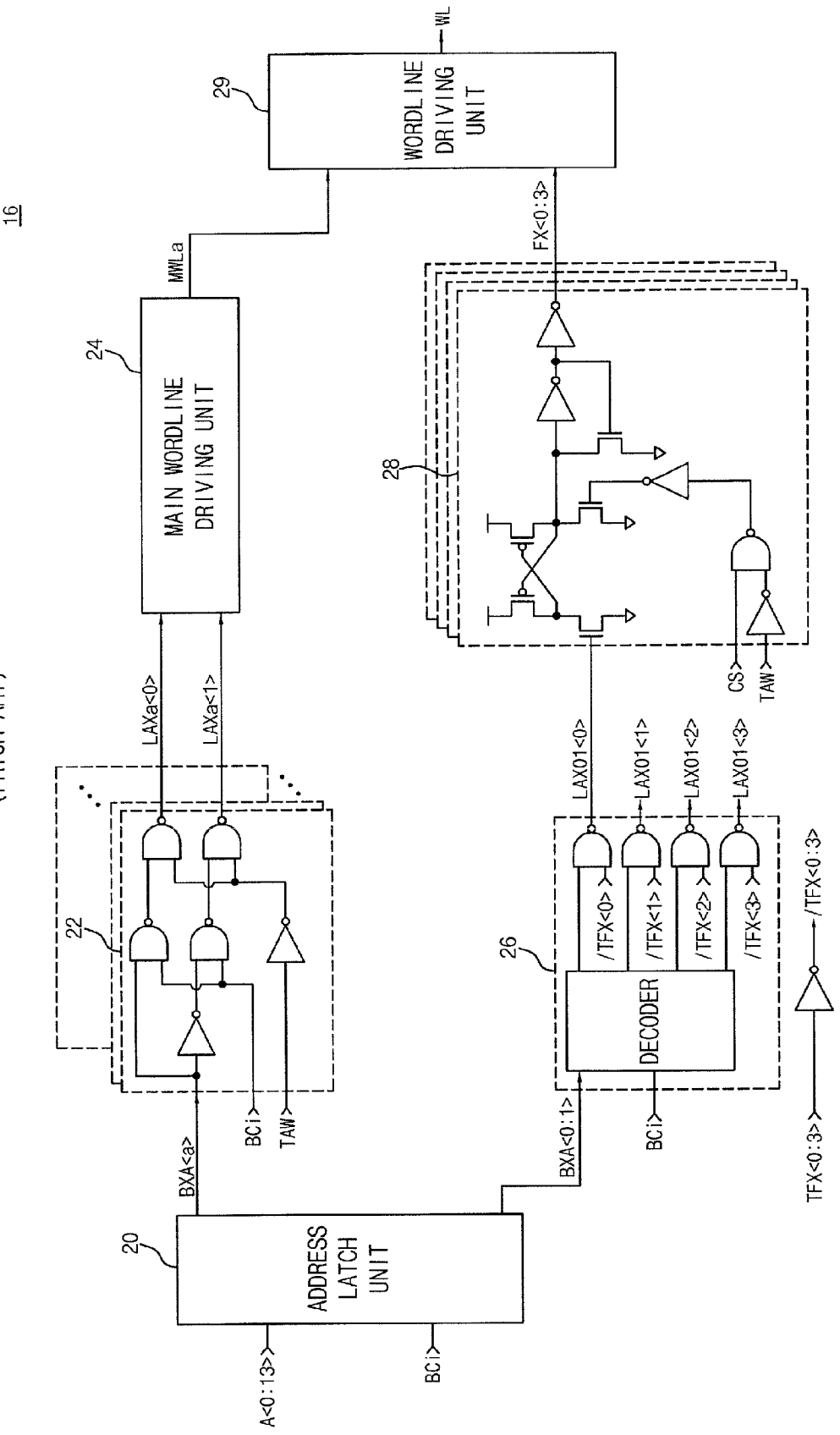
FIG. 2 is a detailed structural view of the respective bank control unit in FIG. 1.
Figure 3:
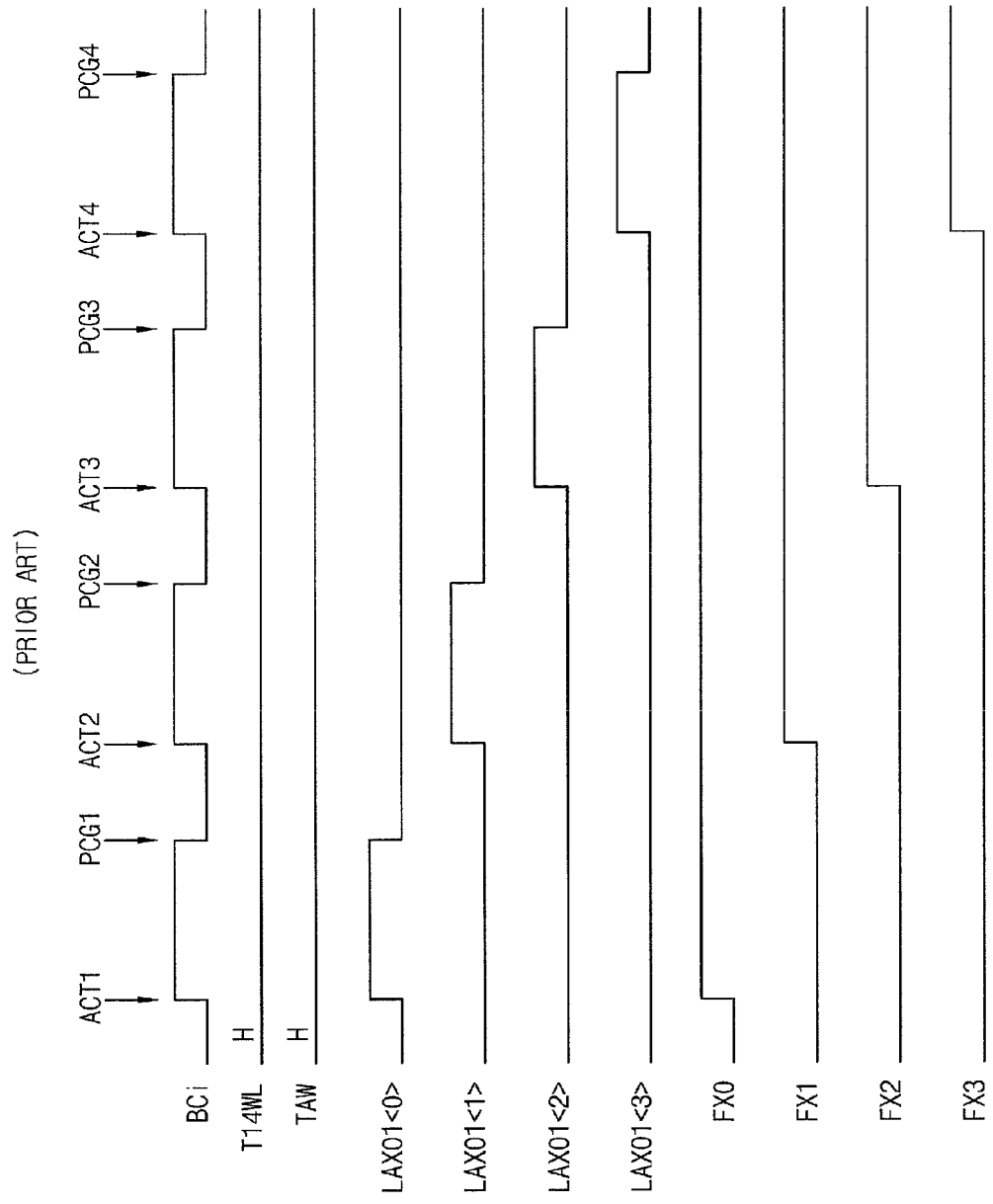
FIG. 3 is an operational waveform diagram of the semiconductor memory testing device according to a related art when continuously performing the multi wordline test.
Figure 4:
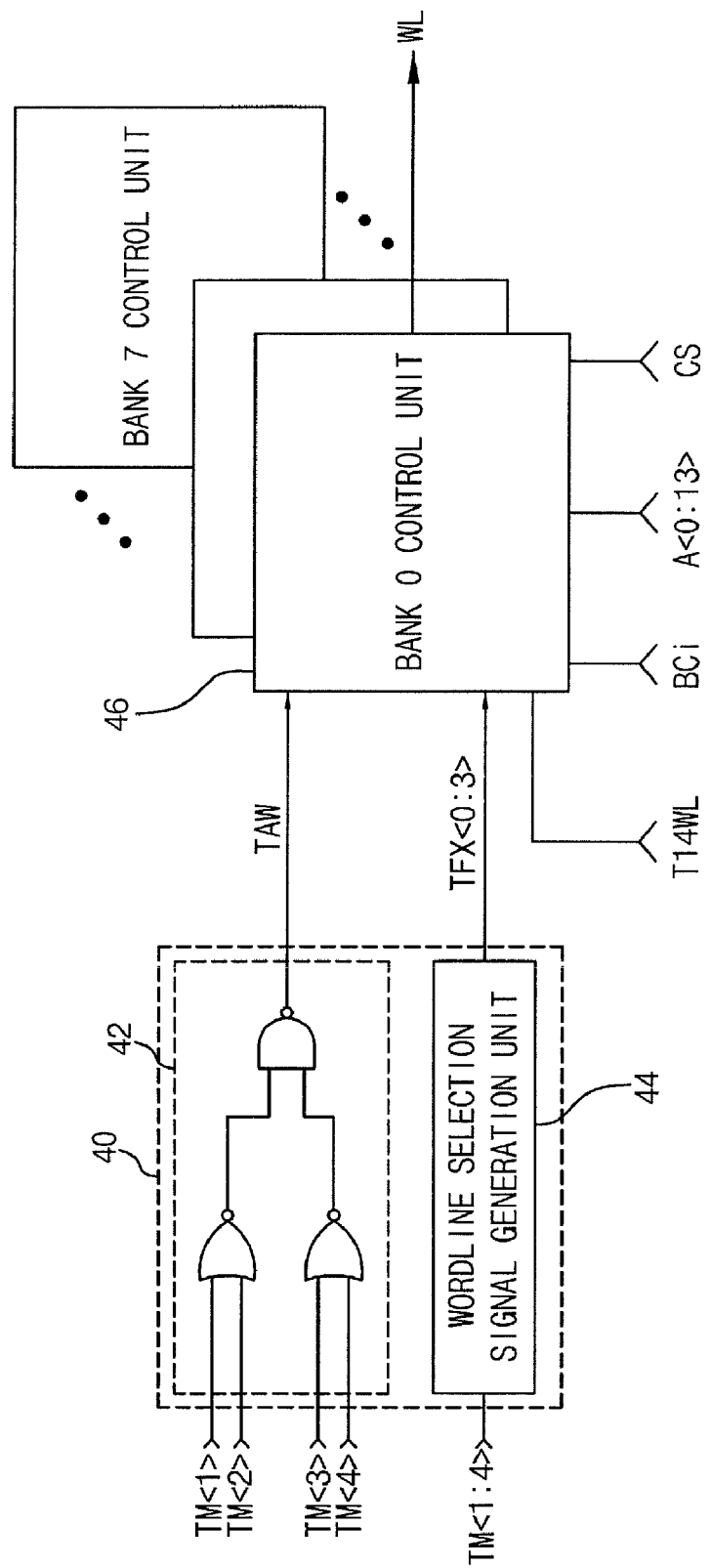
FIG. 4 is a block diagram showing a semiconductor memory testing device performing a multi wordline test according to an embodiment of the present invention.

As depicted in FIG. 4, a semiconductor test device according to an embodiment of the present invention is shown to include a test signal decoder 40 and a plurality of bank control units 46.

The test signal decoder 40 is shown to include first and second burn-in test signal generation units 42 and 44.

The first burn-in test signal generation unit 42 is shown outputting a first burn-in test signal TAW that enables entire main wordline testing when at least one of a plurality of burn-in test mode signals TM<1:4> is set in an enabled state.

The second test signal generation unit 44 is shown to combine the plurality of burn-in test mode signals TM<1:4> and is shown to output second burn-in test signals TFX<0:3> that are subsequently used to selectively enable sub-wordline testing.

Each bank control unit 46 is shown inputting the first and the second burn-in test signals TAW and TFX<0:3>, the multi wordline test mode signal T14WL, the bank control signal BCi, the decoding address signals A<0:13>, and a control signal CS. When the first and second burn-in test signals TAW and TFX<0:3> are in a disabled state, the bank control unit 46 generates a multi wordline test signal WL in accordance to the multi wordline test mode signal T14WL and the bank control signal BCi to perform a multi wordline test.

Herein, the multi wordline test mode signal T14WL is understood to mean a signal for enabling ¼ of the entire wordline that is generated by a mode register set (not shown) and applied to a respective bank. Also, the bank control signal BCi is, as described above, is understood to mean a signal that is provided on a per bank basis for controlling banks, and which is enabled in synchronization with the active signal and disabled in synchronization with the precharge signal.

Figure 5:
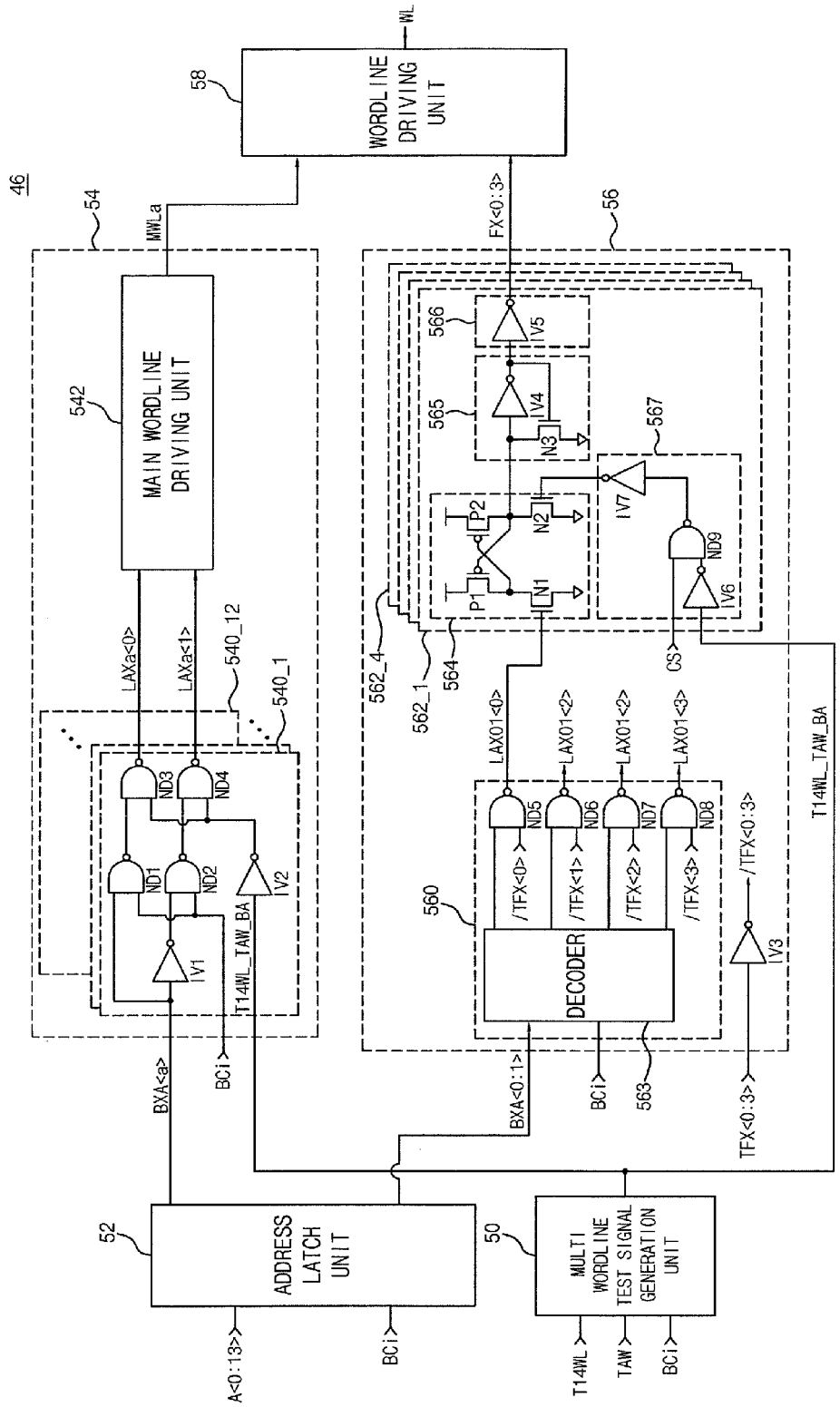
FIG. 5 is a detailed structural view of respective bank control unit in FIG. 4.

As depicted in FIG. 5, each bank control unit 46 is shown to include a multi wordline test signal generation unit 50, an address latch unit 52, a main wordline control unit 54, a sub wordline control unit 56 and a wordline driving unit 58.

When the first burn-in test signal TAW is in a disabled state, the multi wordline test signal generation unit 50 generates the multi wordline test mode signal T14WL as a multi wordline test signal T14WL_TAW_BA which is synchronized with a bank control signal BCi.

When the bank control signal BCi is in an enabled state, the address latch unit 52 latches an inputted address A<0:13>.

The main wordline control unit 54 is shown to include a plurality of main address predecoders 540_1~540_12 and a main wordline driving unit 542.

Each of the main address predecoders 540_1~540_12 can include NAND gates ND1~ND4 and inverters IV1 and IV2.

The NAND gate ND1 is shown receiving the main address BXA<a> outputted from the address latch unit 52 and also shown receiving the bank control signal BCi. The NAND gate ND2 is shown receiving the main address BXA<a> inverted by the inverter IV1 and the bank control signal BCi, thereby predecoding BXA<a>. Also the NAND gate ND3 is shown receiving the output of the NAND gate ND1 and receiving the inverted multi wordline test signal T14WL-TAW_BA outputted from the inverter IV2. The NAND gate ND4 is shown receiving the output of the NAND gate ND2 and receiving the inverted multi wordline test signal T14WL_TAW_BA outputted from the inverter IV2. Thereby the NAND gates ND3 and ND4 are shown outputting the predecoded main address signals LAXa<0:1>.

The main wordline driving unit 542 is shown inputting the predecoded main address signals LAXa<0:1> from the NAND gates ND3 and ND4. The main wordline driving unit 542 is also shown outputting the main wordline driving signal MWLa in accordance to the predecoded main address signals LAXa<0:1> outputted from their respective main address predecoders 540_1~540_12.

The sub wordline control unit 56 is shown to include a sub address predecoder 560 and a plurality of sub wordline driving units 562_1~562_4.

The sub address predecoder 560 is shown to include a decoder 563 that predecodes the sub address BXA<0:1> outputted from the address latch unit 52 in accordance to the bank control signal BCi, NAND gates ND5~ND8 and an inverter IV3.

Each NAND gate ND5~ND8 is shown to receive the output of the decoder 563 and to receive inverted second burn-in test signals TFX<0:3> from the inverter IV3. Each NAND gate ND5~ND8 is shown to output a predecoded sub wordline LAX01<0:3> when the second burn-in test signals TFX<0:3> are in disabled states, Any one of the predecoded sub wordlines LAX01<0:3> is in an enabled state in accordance to the sub address signal BAX<0:1>.

Each of the sub wordline driving units 562_1~562_4 are shown receiving a corresponding predecoded sub address signal LAX01<0:3> outputted from the sub address predecoder 560. Each of the sub wordline driving units 562_1~562_4 are also shown to output or to precharge the respective sub wordline driving signal FX<0:3 in accordance to the multi wordline test signal T14WL_TAW_BA.

The sub wordline driving unit 562_1 is shown to include a shift unit 564, a latch unit 565, an output unit 566 and a precharge unit 567.

The shift unit 564 is shown to include PMOS transistors P1 and P2 and NMOS transistors N1 and N2. The PMOS transistor P1 and the NMOS transistor N1 are shown serially connected between the power voltage supplying terminal VDD and the ground voltage supplying terminal VSS. The gate of the PMOS transistor P1 is shown connected to the output terminal of the shift unit 564, and the gate of the NMOS transistor N1 is shown to be controlled by the predecoded sub address signal LAX01<0>.

The PMOS transistor P2 and the NMOS transistor N2 are shown serially connected between the power voltage supplying terminal VDD and the ground voltage supplying terminal VSS. The gate of the PMOS transistor P2 is shown connected to the common drain terminal of the PMOS transistor P1 and the NMOS transistor N1. The gate of the NMOS transistor N2 is shown controlled by the output of the precharge unit 567.

As a result of this configuration, the shift unit 564 level shifts the predecoded sub address LAX01<0> and outputs it through the common drain terminal of the PMOS transistor P2 and the NMOS transistor N2.

The latch unit 565 is shown to include an inverter IV4 and a NMOS transistor N3.

The inverter IV4 is shown to invert the output of the shift unit 564. The NMOS transistor N3 is shown connected between the output terminal of the shift unit 564 and the ground voltage supplying unit, and the output of the inverter IV4 is shown applied to the gate of the NMOS transistor N3 in order to maintain the output of the shift unit 564.

The output unit 566 is shown to include an inverter IV5 that inverts the output of the latch unit 565 to output the sub wordline driving signal FX<0:3>.

The precharge unit 567 is shown to include inverters IV6 and IV7 and a NAND gate ND9.

The NAND gate ND9 is shown receiving an inverted multi wordline test signal T14WL_TAW_BA from the inverter IV6. The NAND gate ND9 is also shown receiving a control signal CS in which the control signal CS is in an enabled state in a test mode. The inverter IV7 is shown inverting the output of the NAND gate ND9 to apply the output of the inverter IV7 to the shift unit 564. As a result of this configuration the precharge unit 567 drives the NMOS transistor N3 of the shift unit 564 to discharge the output level when the control signal CS is in an enabled state and when the multi wordline test signal T14WL_TAW_BA is in a disabled state.

The sub wordline driving units 562_2~562_4 all have essentially the same or equivalent structure and operation and therefore will not be described any further.

The wordline driving unit 58 is shown driving a plurality of wordlines WL selected in accordance to the main wordline driving signal MWLa applied from the main wordline control unit 54 and in accordance to the sub wordline driving signal FX<0:3> applied from the sub wordline control unit 56.

Figure 6:
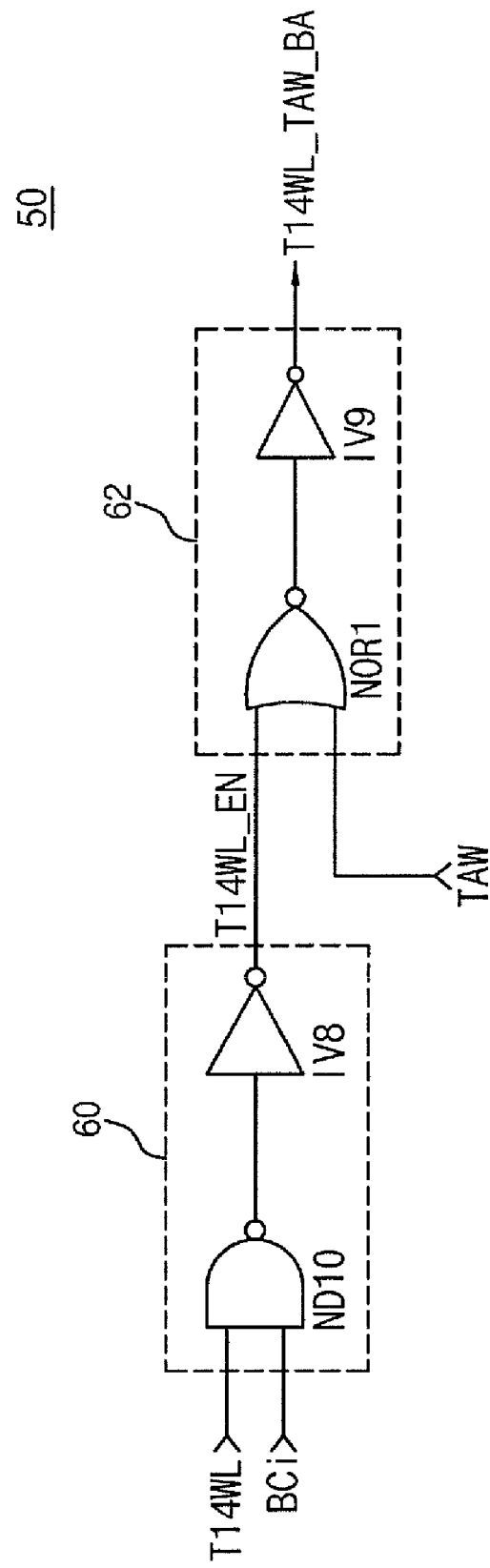
FIG. 6 is a circuit diagram showing a multi wordline test signal generation unit in FIG. 5.

As depicted in FIG. 6, the multi wordline test signal generation unit 50 is shown to include a signal generation unit 60 and an output unit 62.

The signal generation unit 60 is shown to include a NAND gate ND10 and an inverter IV8.

The NAND gate ND10 is shown receiving the multi wordline test mode signal T14WL and receiving the bank control signal BCi, and the output of the NAND gate ND10 is shown inputted into the inverter IV8 which in turn outputs a signal T14WL_EN.

The output unit 62 is shown to include a NOR gate NOR1 and an inverter IV9.

The NOR gate NOR1 is shown receiving the output of the signal generation unit 60 and receiving the first burn-in test signal TAW. The inverter IV9 is shown inverting the output of the NOR gate NOR1 to output the multi wordline test signal T14WL_TAW_BA.

Accordingly the multi wordline test signal generation unit 50 outputs a multi wordline test signal T14WL_TAW_BA that maintains an enabled state when the first burn-in test signal TAW is enabled, and outputs a multi wordline test signal T14WL_TAW_BA that is synchronized with the bank control signal BCi when the first burn-in test signal TAW is disabled. The waveform of the multi wordline test signal T14WL_TAW_BA at this time is the same as the waveform of the bank control signal BCi.

An operation of the semiconductor test device of the present invention will be described with reference to FIGS. 4 to 6.

At first, in a normal mode, the burn-in test mode signals TM<1:4> and the multi wordline test mode signal T14WL are set in a disabled state, and the resultant first and second burn-in test signals TAW and TFX<0:3> and the multi wordline test signal T14WL_TAW_BA and the control signal CS are also set in a disabled state.

The semiconductor test device predecodes the main address BXA<a> and the sub address BXA<0:1> in accordance to the bank control signal BCi to output the predecoded main address LAXa<0:1> and to output the predecoded sub address LAX01<0:3>. Thereby the semiconductor test device generates the main wordline driving signal MWLa and the sub wordline driving signal FX<0:3> and drives the corresponding wordline WL to perform the normal operation.

Next, in a burn-in test mode, the first burn-in test signal TAW is set in an enabled state that subsequently leads to the multi wordline test signal T14WL_TAW_BA, the respective second burn-in test signals TFX<0:3> and the control signal CS all being set in an enabled state.

Since the semiconductor test device sets all the predecoded main address LAXa<0:1> in an enabled state regardless of the address A<0:13> and regardless of the bank control signal Bci, and since the semiconductor test device selectively sets the predecoded sub address signals LAX01<0:3> in enabled states in accordance to the second burn-in test signal, the main wordline driving signal MWLa is set in an enabled state and the sub wordline driving signal FX<0:3> is selectively set in an enabled state and subsequently outputted. Accordingly the entire wordlines WL or some of the wordlines WL are driven to perform the burn-in test operation.

Finally, in the multi wordline test mode, the first and second burn-in test signals TAW and TFX<0:3> are set in a disabled state, the control signal CS is set in an enabled state and the multi wordline test mode signal T14WL is set in an enabled state.

Since the semiconductor test device synchronizes the multi wordline test mode signal T14WL with the bank control signal BCi to output the multi wordline test signal T14WL_TAW_BA, the semiconductor test device performs the multi wordline test on a per bank basis. This is because the multi wordline test signal T14WL_TAW_BA is maintained in a disabled state if the bank control signal BCi is not in an enabled state even though the multi wordline test mode signal T14WL is in an enabled state.

In the bank selected by enabling of the bank control signal BCi, the predecoded main address signal LAXa<0:3> is set in an enabled state and outputted in accordance to the multi wordline test signal T14WL_TAW_BA regardless of the main address BXA<a>. Accordingly the entire wordline driving signals MWLa of the corresponding bank are set in an enabled state. Also, since any one of the predecoded sub address signals LAX01<0:3> are set in an enabled state and subsequently outputted in accordance to the sub address BXA<0:3>, any one of the four sub wordline driving signals FX<0:3> is set in an enabled state. As the result, ¼ of the entire wordlines within that one corresponding bank are driven at the same time when the multi wordline test is performed.

Figure 7:
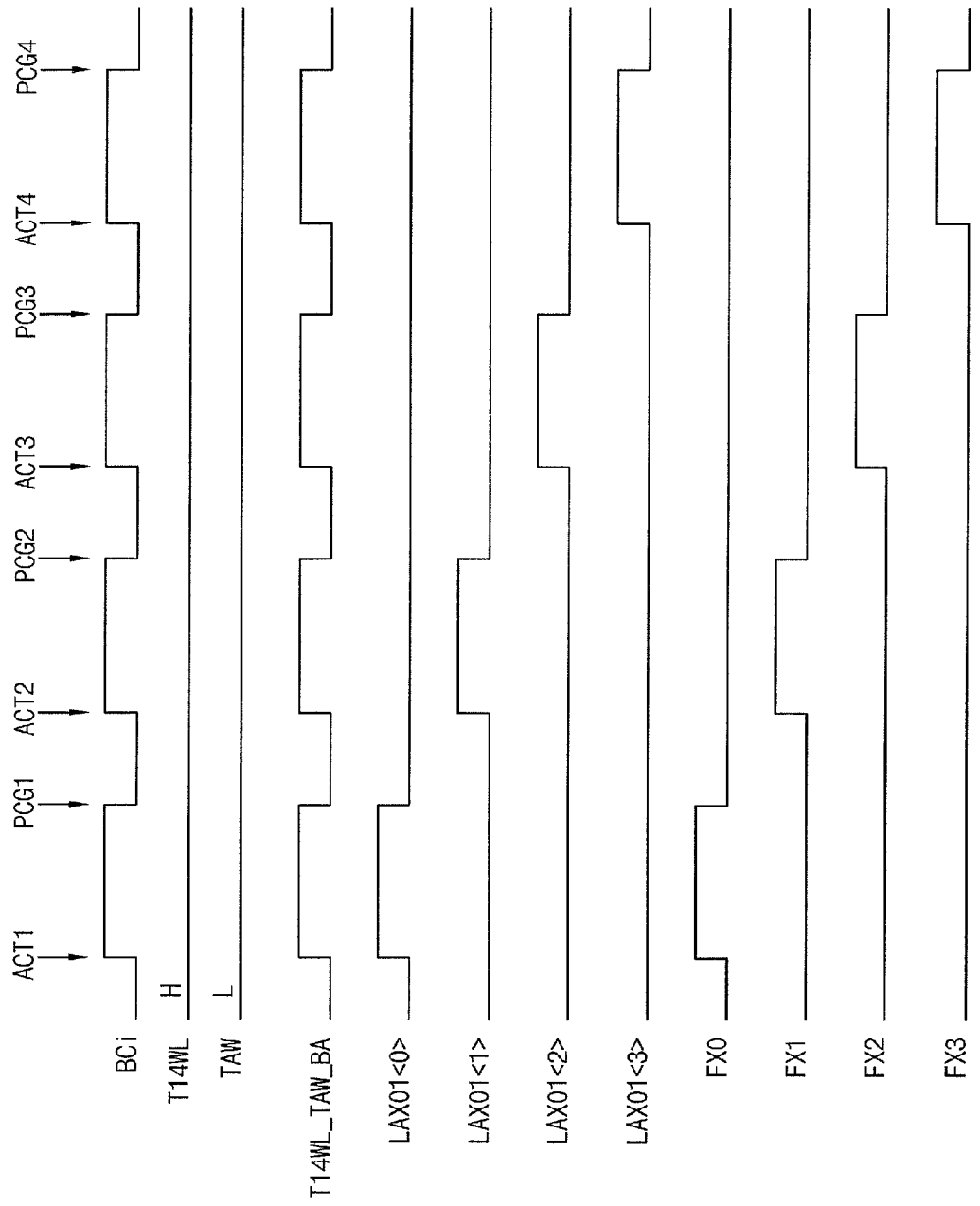
FIG. 7 is an operational waveform diagram of the semiconductor memory testing device according to an embodiment of the present invention when performing continuously the multi wordline test.

As depicted in FIG. 7, the semiconductor test device according to an embodiment of the present invention can perform a continuous multi wordline test.

Herein, it is understood that the active signals ACT1 through ACT4 and the precharge signals PCG1 through PCG4 are assumed to be continuously applied and that the sub address signals BXA<0:3> and the predecoded address signals LAX01<0:3> are sequentially changed.

In the multi wordline test mode, the first burn-in test signal TAW is set in a disabled state as a low level and the multi wordline test mode signal T14WL is maintained in an enabled state of a high level.

In the multi wordline test mode, the bank active signal BCi is alternately set in an enabled and disabled state in accordance to the active signals ACT1 through ACT4 and in accordance to the precharge signals PCG1 through PCG4, and the multi wordline test signal T14WL_TAW_BA is outputted in synchronization therewith.

In the multi wordline test mode, the predecoded sub address signal LAX01<0> is set in an enabled state as a high level in synchronization with the active signal ACT1 and is set in a disabled state as a low level in synchronization with the precharge signal PCG1. Likewise, predecoded sub address signals LAX01<1:3> are set in an enabled state as a high level in synchronization with the respective active signals ACT2 through ACT4 and is set in a disabled state as a low level in synchronization with the precharge signals PCG2 through PCG4.

Referring to the sub wordline driving unit 562_1 [561_1->562_1] in FIG. 5, when the predecoded sub address signal LAX01<0> is set in an enabled state in accordance to the active signal ACT1, the output terminal of the shift unit 564 outputs it in a high level and thus the sub wordline driving signal FX<0> is set in an enabled state. After that, the multi wordline test signal T14WL_TAW_BA is set in a disabled state in accordance to the precharge signal PCG1 to drive the precharge unit 567 and thus the output terminal of the shift unit 564 is precharged to a low level, thereby setting the sub wordline driving signal FX<0> in a disabled state.

Likewise, the predecoded sub address signal LAX01<1:3> is set in an enabled state in accordance to the active signals ACT2 through ACT4. The sub wordline driving signal FX<1:3> is set in an enabled state in accordance to the predecoded sub address signal LAX01<1:3> so that the sub wordline driving signal FX<1:3> is precharged by the multi wordline test signal T14WL_TAW_BA and is set in a disabled state in accordance to the precharge signals PCG2 through PCG4.

As the result, it is possible to constantly maintain the number of the wordlines that are enabled at the same time, as well as, it is possible to perform a continuous multi wordline test and thus reduce time and cost for the testing operations.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:
1. A semiconductor test device for testing word lines in a plurality of banks, comprising:
    a test signal decoder decoding burn-in test mode signals to generate a first test signal which controls main wordline driving signal and a second test signal which controls sub wordline driving signal; and a plurality of bank control units generating a multi wordline test mode signal corresponding to a bank control signal when the first and second test signals are disabled, enabling the main wordline driving signal regardless of some of a plurality of addresses when the multi wordline test signal is enabled, enabling the main wordline driving signal in response to the some of addresses when the multi wordline test signal is disabled, and simultaneously enabling a plurality of wordlines in accordance to the main wordline driving signal to perform a test.

2. The semiconductor test device as set forth in claim 1, wherein the test signal decoder comprises:
a first test signal generation unit enabling and outputting the first test signal when any one of the burn-in test mode signals is enabled; and
a second test signal generation unit selectively enabling and outputting the second test signals in accordance to a combination of the burn-in test mode signals.

3. The semiconductor test device as set forth in claim 1, wherein each bank control unit comprises:
a multi wordline test signal generation unit outputting a multi wordline test mode signal corresponding to the bank control signal when the first test signal is disabled;
a main wordline control unit predecoding the some of the plurality of addresses to output the main wordline driving signal controlled in accordance to the multi wordline test signal;
a sub wordline control unit predecoding a remaining portion of the plurality of addresses to output a sub wordline driving signal when the second test signals are disabled, and precharging an output node for the sub wordline driving signal in accordance to the multi wordline test signal; and
a wordline driving unit applied with the main wordline driving signal and the sub wordline driving signal and simultaneously driving a plurality of wordlines in accordance to enabling of the main wordline driving signal and the sub wordline driving signal.

4. The semiconductor test device as set forth in claim 3, wherein the bank control signal is enabled in accordance to an active signal and disabled in accordance to a precharge signal.

5. The semiconductor test device as set forth in claim 3, wherein the multi wordline test signal generation unit comprises:
a signal generation unit outputting the multi wordline test mode signal as a signal synchronized with the bank control signal; and
an output unit outputting the output of the signal generation unit as the multi wordline test signal when the first test signal is disabled.

6. The semiconductor test device as set forth in claim 3, wherein the main wordline control unit comprises:
a plurality of main address predecoders predecoding some of the plurality of the addresses and enabling and outputting all the predecoded signals when the multi wordline test signal is enabled, respectively; and
a main wordline driving unit outputting the main wordline driving signal in accordance to outputs of the main address predecoders.

7. The semiconductor test device as set forth in claim 3, wherein the sub wordline control unit comprises:
a sub address predecoder predecoding and outputting the remaining portion of the plurality of addresses when the second test signals are disabled; and
a plurality of sub wordline driving units outputting the sub wordline driving signal that correspond to respective outputs of the sub address predecoder, and precharging the output node for the enabled sub wordline driving signal when the multi word line test signal is disabled.

8. The semiconductor test device as set forth in claim 7, wherein each sub wordline driving unit comprises:
a shift unit shifting a potential of the signal outputted from the sub address predecoder;
a latch unit latching the output of the shift unit;
an output unit inversely driving the output of the latch unit to output the sub wordline driving signal; and
a precharge unit precharging the output node of the shift unit in accordance to the multi wordline test signal.

9. The semiconductor test device as set forth in claim 8, wherein the precharge unit comprises:
a first inverter inverting the multi wordline test signal;
a NAND gate receiving the output of the first inverter and a control signal enabled in a test mode; and
a second inverter inverting an output of the NAND gate and delivering the output of the NAND gate to the shift unit.

10. A semiconductor test device, comprising:
a test signal decoder configured to decode test signals, and generate a first test signal which controls a main wordline driving signal and a second test signal which controls sub wordline driving signals; and
a plurality of bank control units configured to generate a multi test mode signal in response to a bank control signal, the first test signal and the second test signal, and to multi-test the sub wordlines in response to the multi test mode signal.

11. The semiconductor test device as set forth in claim 10, wherein the multi test mode signal is generated in response to the bank control signal when the first and second test signals are disabled.

12. The semiconductor test device as set forth in claim 10, wherein the main wordline driving signal is enabled by addresses when the multi test mode signal is disabled, and is enabled regardless of the addresses when the multi test mode signal is enabled.

* * * * *